United States Patent [19]
Matsumoto et al.

[11] Patent Number: 4,893,172
[45] Date of Patent: Jan. 9, 1990

[54] CONNECTING STRUCTURE FOR ELECTRONIC PART AND METHOD OF MANUFACTURING THE SAME

[75] Inventors: Kunio Matsumoto; Muneo Oshima, both of Yokohama; Suguru Sakaguchi, Chigasaki, all of Japan

[73] Assignee: Hitachi, Ltd., Tokyo, Japan

[21] Appl. No.: 143,200

[22] Filed: Jan. 13, 1988

[30] Foreign Application Priority Data

Jan. 19, 1987 [JP] Japan ................................ 62-8004

[51] Int. Cl.⁴ ............... H01L 23/36; H01L 23/48; H01L 21/603
[52] U.S. Cl. .................................. 357/79; 357/80; 357/81; 357/68
[58] Field of Search ............ 357/80, 74, 81, 68, 357/79; 174/52 FP, 52 H, 52 PE, 68.5; 361/413, 420, 419, 418, 417

[56] References Cited
U.S. PATENT DOCUMENTS
4,607,276 8/1986 Butt .............................. 357/81

FOREIGN PATENT DOCUMENTS
110441 3/1986 Japan.

OTHER PUBLICATIONS
"Full Semiconductor Wafer Package"—Watson—IBM Technical Disclosure Bulletin—vol. 18, No. 3, Aug. 1975, p. 642.

Primary Examiner—Rolf Hille
Assistant Examiner—S. V. Clark
Attorney, Agent, or Firm—Fay, Sharpe, Beall, Fagan, Minnich & McKee

[57] ABSTRACT

Disclosed is a connecting structure for electrically connecting an electronic part such as an LSI chip to a substrate and a method of manufacturing the same. The present invention is suitable especially for electrical connection between a plurality of chips and a substrate which is required to have a function of absorbing a difference in thermal expansion in the horizontal direction and to deform in the vertical direction, and characterized in that a conductive flat spring having a height not more than the minimum length in the lateral direction is provided between the electronic part such as a chip and a wires substrate.

20 Claims, 3 Drawing Sheets

CONNECTING STRUCTURE FOR ELECTRONIC PART AND METHOD OF MANUFACTURING THE SAME

BACKGROUND OF THE INVENTION

The present invention relates to a connecting structure for electrically connecting an electronic part to a substrate.

DESCRIPTION OF THE PRIOR ART

Flip chip bonding is known as a method for connecting an electronic part such as an LSI chip (hereinunder referred to as "chip") having a multiplicity of junction points directly to a substrate by soldering. In the case of using a ceramic or glass-epoxy resin material for the substrate, however, since there is a difference in thermal expansion coefficient between the chip and the material of the substrate, the difference in thermal expansion due to a temperature change acts on the soldered portion, thereby disadvantageously shortening the breaking life of the soldered portion.

Concerning this problem, Japanese Patent Laid-Open No. 110441/1986, "METHOD OF MANUFACTURING DEFORMATION-FREE MULTI BONDING STRUCTURE FOR ELECTRICALLY CONNECTING MICROELECTRONIC ELEMENT" discloses a structure which absorbs a difference in thermal expansion in the horizontal direction. FIG. 4 is a schematic view of the conventional structure disclosed in the above-described specification. A conductive flat spring 100 having a height several times the minimum length in the lateral direction is connected to two conductive pins 101 and 102, which are connected to a chip 3 and a substrate 4. The conductive flat spring 100 absorbs the difference in thermal expansion in the horizontal direction between the chip 3 and the substrate 4 and serves to reduce the shear stress of a solder 31, thereby prolonging the breaking life of the soldered portion.

In the above-described structure, a sufficient rigidity for resisting the pressure for the contact bonding of a heat transfer block which is thermally connected to the back surface (upper surface) of the chip 3 is secured in the vertical direction, and the structure does not therefore deform in the vertical direction. Accordingly, a cooling means for the chip 3 has the following problems.

Incidentally, the reference numeral 32 in FIG. 4 represents a chip electrode, and 42 a substrate electrode.

When a plurality of chips connected to the same substrate through the above-described conventional connecting structure are cooled from the back surface (upper surface), the back surfaces of the chips are not flush with each other due to the warp of the substrate or the nonuniformity in the height at which the chips are connected to the substrate. It is therefore necessary to thermally connect heat transfer blocks separately to the back surfaces of the chips in conformity with the back surfaces of the respective chips. In other words, a means for contact bonding a heat transfer block to the back surface of the chip which has a function of controlling the vertical position of the heat transfer block or the pressure for contact bonding the transfer block separately for each chip is essential. However, a heat transfer system having a function of controlling the vertical position of a heat transfer block or the pressure for contact bonding the heat transfer block while maintaining a low-heat resistance has a considerably complicated structure, thereby having many problems in the workability, assembly operation, and reliability.

SUMMARY OF THE INVENTION

Accordingly, it is an object of the present invention to eliminate the above-described problems in the prior art and to provide an electrical connecting structure which is freely deformable within a certain range in the vertical direction without lowering the function of absorbing the difference in thermal expansion in the horizontal direction between a chip and a substrate.

To achieve this aim, the present invention is characterized in that a conductive flat spring or lead member sufficiently deformable both in the horizontal direction and in the vertical direction is used between an electronic part having junction points or electrodes and a substrate.

The present invention will be explained hereinunder in more detail.

A conductive flat spring having a height not more than the minimum length in the lateral direction is adopted for the chip connecting structure, thereby making it possible to move each chip upward separately from each other within a certain range while keeping electrical connection and to thermally connect the chip to a heat transfer block without moving the heat transfer block separately from each other. It is therefore possible to greatly simplify the structure of a heat transfer block.

Furthermore, the conductive flat springs are fabricated on an insulation sheet at one time, thereby facilitating the connection between the chip, the conductive flat spring and the substrate.

The above and other objects, features and advantages of the present invention will become clear from the following description of the preferred embodiments thereof, taken in conjunction with the accompanying drawings.

BRIEF DESCRIPTION OF THE DRAWINGS

FIG. 1 shows the structure of conductive flat springs in accordance with the present invention, wherein FIG. 1(a) is a plan view of the conductive flat springs fabricated on an insulation sheet at one time;

FIGS. 1(b) and 1(c) are sectional views of the insulation sheet shown in FIG. 1(a), taken along the line A—A, wherein FIG. 1(c) is a sectional view of the insulation sheet shown in FIG. 1(b) with the conductive flat springs deformed in the vertical direction;

FIG. 2 shows the positional relationship between an LSI chip, a wired substrate and a heat transfer block, wherein FIG. 2(a) shows the LSI chips, the wired substrate and the heat transfer block before bonding, showing that there is a difference in height between each chip; and FIG. 2(b) shows the LSI chips, the wired substrate and the heat transfer block bonded together through thermal connecting portions;

DESCRIPTION OF THE PREFERRED EMBODIMENTS

Figure 2:
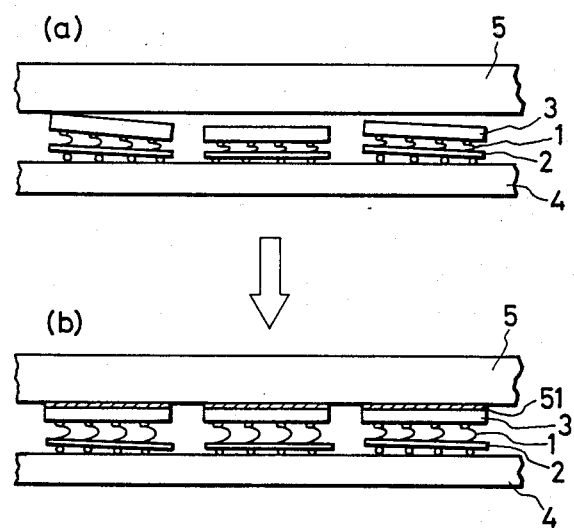
Figure 3:
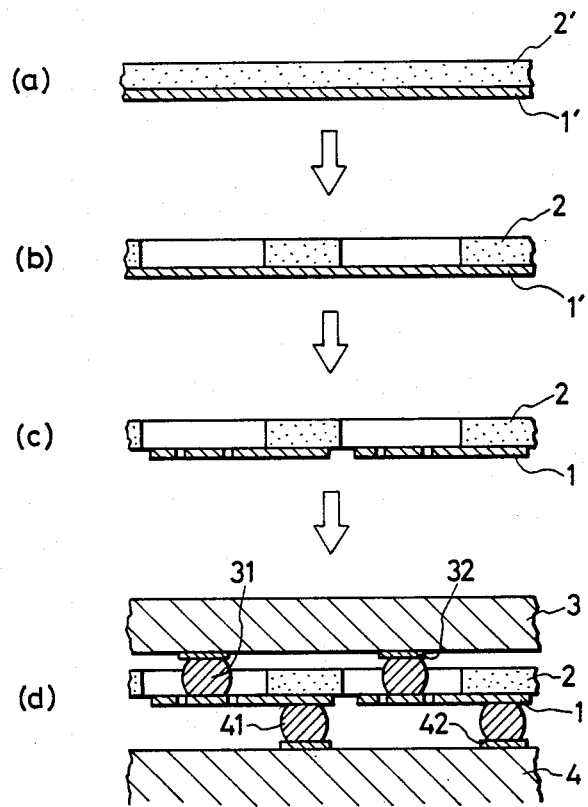
FIGS. 3(a) to 3(d) show the manufacturing process for the connecting structure according to the present invention.
Figure 4:
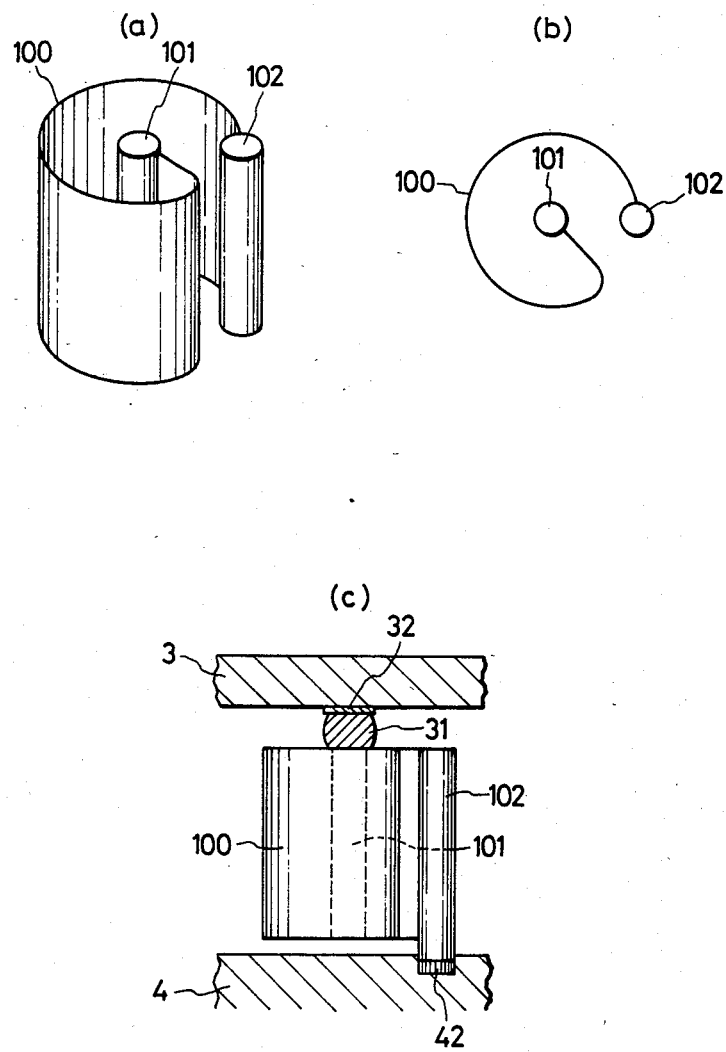
FIG. 4(a–c) shows a conventional connecting structure.

Embodiments of the present invention will be explained hereinunder with reference to FIGS. 1, 2 and 3.

Figure 1:
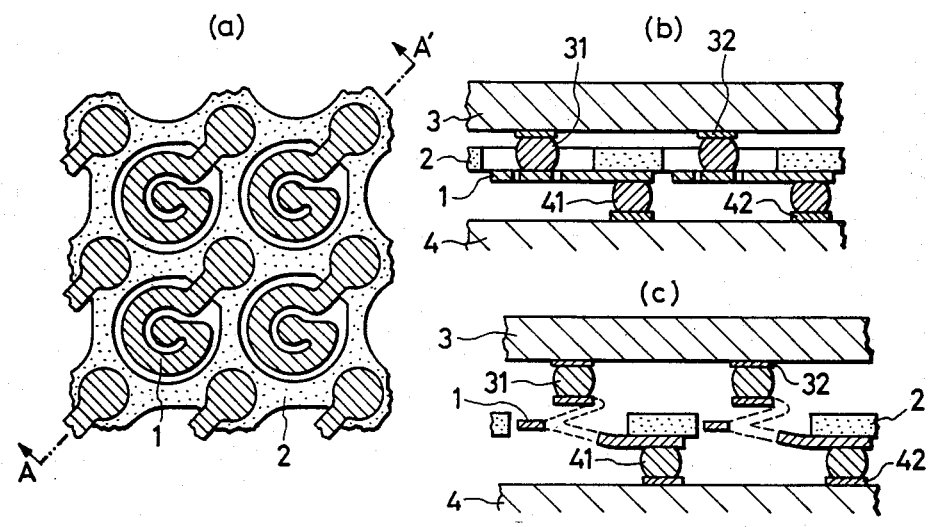

FIG. 1(a) is a plan view of the conductive flat springs or lead member in accordance with the present invention fabricated on an insulation sheet at time; FIG. 1(b) is a sectional view of the insulation sheet shown in FIG. 1(a), taken along the line A—A, in the state of being connected to the conductive flat springs; and FIG. 1(c) is a sectional view of the insulation sheet (elevational view of the conductive flat springs) shown in FIG. 1(b), showing the connected state when the chip is moved upward after the connection. FIG. 2 shows the positional relationship between a chip, a wired substrate and a heat transfer block in the case of adopting a connecting structure according to the present invention, wherein FIG. 2 (a) shows the chips before being thermally connected to the heat transfer block, and FIG. 2 (b) shows the chips after the thermal connection. FIG. 3 shows the manufacturing method for the connecting structure according to the present invention. In FIGS. 1 to 3, the reference numeral 1 represents a conductive flat spring, 2 an insulation sheet, 3 a chip, 4 a substrate, 5 a heat transfer block, 31 and 41 solder, 32 a chip electrode, 42 a substrate electrode, 51 a thermal bonding portion using a heat transfer grease such as diamond grease, 1' a conductive flat spring material and 2' an insulation sheet material.

FIG. 1(a) shows an example of using spiral conductive flat springs 1 or lead members, hereinafter referred to as conductive flat springs 1. Each of the conductive flat springs 1 is placed on the insulation sheet 2 with the center of the spiral in alignment with the hole which is formed therein in correspondence with the position of the chip electrode 32 and the other end of the spiral secured to the insulation sheet 2. The center of each of these conductive flat springs 1 is connected to the chip electrode 32 by the solder 31, and the other end thereof is connected to the substrate electrode 42 by the solder 41, as shown in FIG. 1(b).

The above-described electrical connecting structure for the chip 3 and the substrate 4 enables the chips 3 to move upward within a certain range separately from each other while keeping the electrical connection, as shown in FIG. 1(c). This function enables the chips 3 to be thermally connected to the heat transfer block 5 through the thermally bonding portion 51 while absorbing the warp of the substrate 4 and the nonuniformity in height at which the chips 3 are connected to the substrate 4 when a plurality of chips 3 are connected to the same substrate 4, as shown in FIGS. 2(a) and 2(b). The above-described connecting structure is also capable of absorbing the difference in thermal expansion in the horizontal direction between the chips 3 and the substrate 4, thereby prolonging the breaking life of a bonding system such as the solders 31 and 41.

The same effect is also obtained by inverting the insulation sheet 2 provided with the conductive flat springs 1 thereon and connecting the centers of the conductive flat springs 1 to the substrate electrodes 42 and the other ends to the chip electrodes 32.

A method of manufacturing the above-described connecting structure will now be explained with reference to FIG. 3. As shown in FIG. 3(a), a thin conductive flat spring material 1' (copper, a copper alloy or a composite metal of copper) and an insulation sheet material 2' are first adhered. As the insulation sheet material 2', a polyimide resin, glass, epoxy resin, glass-polyimide resin, polyester resin, polyimide resin containing quartz fiber, or a polyimide, epoxy or polyester resin containing carbon fiber is used. Among these, a polyimide resin, glass epoxy resin and glass polyimide resin are preferable from the point of view of heat resistance.

Holes each of which is larger than the spiral portion of the conductive flat spring 1 are next formed on the insulation sheet material 2' at the positions corresponding to the positions of the chip electrodes 32 by photoetching or punching, thereby obtaining the insulation sheet 2, as shown in FIG. 3(b). A spiral shape shown in FIG. 1(a) is formed at predetermined positions of the conductive flat spring material 1' by photoetching to obtain the conductive flat spring 1, as shown in FIG. 3(c). Since photoetching is conducted while one end of each conductive flat spring 1 is fixed on the insulation sheet 2, it is possible to form a plurality of conductive flat springs 1 at one time with a good positional accuracy relative to each other, and handling is facilitated as a whole. Finally, the conductive flat springs 1 are connected to the respective chip electrodes 32 and the substrate electrodes 42 by the solders 31 and 41, respectively, as shown in FIG. 3(d).

In the above-described manufacturing method, it is also possible to form predetermined holes in the insulation sheet material 2' before adhering the conductive flat spring material 1' to the insulation sheet material 2', and thereafter adhere the conductive flat spring material 1' with the insulation sheet material 2', as shown in FIG. 3(b). It is also possible to connect the conductive flat spring 1 and the chip electrode 32 or the substrate electrode 42 by thermocompression bonding, brazing or welding in place of soldering with the solders 31 and 41.

The dimensions of the conductive flat spring in accordance with the present invention will here be explained in detail. The preferable dimensional range of the conductive flat spring having a configuration shown in FIG. 1 is 10 to 40 $\mu$m in thickness and 40 to 70 $\mu$m in width. The spring constant of thereof is 100 to 600 g/mm in the horizontal direction, and 25 to 90 g/mm in the vertical direction. The density of the junction points or electrodes is 600 to 1200 points/100 mm$^2$.

The most preferable dimensions are 20 $\mu$m in thickness, 50 $\mu$m in width, 350 g/mm in horizontal spring constant, 65 g/mm in the vertical spring constant, and 1000 points/100 mm$^2$. in density of the junction point.

As described above in detail, the electrical connecting structure according to the present invention enables a plurality of chips to be thermally connected to a heat transfer block separately from each other without impairing the function of absorbing the difference in thermal expansion in the horizontal direction between the chips and a substrate, thereby greatly simplifying the structure of a cooling system. More specifically, in comparison with a conventional complicated cooling system in which the nonuniformity in the back surface level of a plurality of chips produced due to the limitation of fabrication and assembly technique is absorbed by means for controlling the vertical position or the pressure for contact bonding separately for each chip, the connecting structure according to the present invention obviates these controlling functions, thereby greatly simplifying the structure of the cooling system. Thus, the connecting structure of the present invention manifests the effect of excellent assembly workability and reliability in mounting high exothermic chips at a high density.

While there has been described what are at present considered to be preferred embodiments of the invention, it will be understood that various modifications may be made thereto, and it is intended that the appended claims cover all such modifications as fall within the true spirit and scope of the invention.

We claim:

1. A connecting structure for an electronic part comprising:
   said electronic part having at least an electrode;
   a substrate to be electrically connected to said electrode of said electronic part; and
   a lead member having a planar shape of a curved line, and a width greater than a thickness of said lead member, and said lead member being connected between said electrode and said substrate such that said electronic part and said substrate are mutually deformable relative to one another in any of a horizontal and vertical direction.

2. A connecting structure for an electronic part according to claim 1, wherein said lead member has a spiral shape.

3. A connecting structure for an electronic part according to claim 2, wherein said lead member, said substrate and said electronic part are connected by a soldered connection.

4. A connecting structure for an electronic part according to claim 2, wherein said lead member, said substrate and said electronic part are connected by a thermocompression bonded connection.

5. A connecting structure for an electronic part according to claim 2, wherein said lead member, said substrate and said electronic part are connected by a brazed connection.

6. A module comprising:
   electronic parts each having a plurality of electrodes;
   a substrate to install said electronic parts; and
   lead members each having a planar shape of a curved line, and width greater than the thickness of said lead member, and each said lead member being connected between each of said electrodes and said substrate such that each of said electronic parts and said substrate are mutually deformable relative to one another in any of a horizontal and vertical direction.

7. A connecting structure for an electronic part according to claim 1, wherein said lead member is 10 to 40 μm in thickness and 40 to 70 μm in width.

8. A connecting structure for an electronic part according to claim 1, wherein the spring constant of said lead member is 100 to 600 g/mm in the horizontal direction and 25 to 90 g/mm in the vertical direction.

9. A connecting structure for an electronic part according to claim 1, wherein said lead member is made of copper, a copper alloy or a composite metal of copper.

10. A connecting structure for an electronic part according to claim 1, wherein said lead member is integrally provided with said insulation sheet.

11. A connecting structure for an electronic part according to claim 10, wherein said insulation sheet is made of a polyimide resin, glass-epoxy resin, glass-polyimide resin, polyester resin, polyimide resin containing quartz fiber, or a resin containing carbon fiber.

12. A connecting structure for an electronic part according to claim 1, wherein said substrate is composed of a ceramic or a glass-epoxy resin material.

13. A module according to claim 6, wherein said lead members are fabricated on an insulation sheet at one time.

14. A module according to claim 13, wherein said insulation sheet is provided with holes at positions corresponding to said plurality of electrodes of said electronic part, and said lead members are arranged on said insulation sheet such that one end of each of said lead members is adhered to said insulation sheet and the other end thereof is positioned at the hole portion of said insulation sheet.

15. A connecting structure for an electronic part according to claim 1, wherein the ratio of said width (W) to said thickness (T) is within the range of 1 to 7 (W/T=1 to 7).

16. A connecting structure for an electronic part according to claim 1, wherein an angular distance of said lead member from said electrode to the connecting point of said substrate is greater than 360°.

17. A connecting structure for an electronic part according to claim 1, wherein said planar shape of a curved line is a spiral shape.

18. A connecting structure for an electronic part according to claim 1, wherein said lead member is part of a conductive layer etched to form said shape and fixed on an insulation sheet.

19. A connecting structure for an electronic part according to claim 2, wherein said lead member, said substrate and said electronic part are connected by a welded connection.

20. A module comprising:
   electronic parts each having a plurality of electrodes;
   a substrate to install a plurality of said electronic parts;
   lead members each having a planar shape of a curved line, and a width greater than the thickness of said lead members, and each said lead member being connected between each of said electrodes and said substrate such that each of said electronic parts and said substrate are mutually deformable relative to one another in any of a horizontal and vertical direction; and
   at least one heat transfer block thermally connected to said electronic parts for cooling said electronic parts.

* * * * *